US012581632B2

(12) United States Patent
Kim et al.

(10) Patent No.: US 12,581,632 B2
(45) Date of Patent: Mar. 17, 2026

(54) MAPPING DEVICE INCLUDING ELECTROSTATIC CHUCK AND ANTI-SEPARATION FRAME

(71) Applicant: Samsung Display Co., Ltd., Yongin-si (KR)

(72) Inventors: Myungkyu Kim, Cheonan-si (KR); Kyongho Hong, Hwaseong-si (KR); Chang-Kon Park, Cheonan-si (KR); Sukbeom You, Anyang-si (KR); Dongjae Lee, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 296 days.

(21) Appl. No.: 18/174,513

(22) Filed: Feb. 24, 2023

(65) Prior Publication Data

US 2023/0292482 A1      Sep. 14, 2023

(30) Foreign Application Priority Data

Mar. 14, 2022      (KR) ........................ 10-2022-0031483

(51) Int. Cl.
| | |
|---|---|
| *H05K 13/04* | (2006.01) |
| *H05K 13/00* | (2006.01) |
| *H05K 13/08* | (2006.01) |

(52) U.S. Cl.
CPC ..... *H05K 13/0812* (2018.08); *H05K 13/0015* (2013.01)

(58) Field of Classification Search
CPC . H01L 21/681; H01L 21/6831; C23C 14/042; H05K 13/0812; H05K 13/0015; H10K 59/10
See application file for complete search history.

(56) References Cited

U.S. PATENT DOCUMENTS

| | | | | |
|---|---|---|---|---|
| 6,285,417 | B1 * | 9/2001 | Ahn ....................... | G06F 3/0444 |
| | | | | 349/23 |
| 7,364,633 | B2 | 4/2008 | Lim et al. | |
| 10,277,887 | B2 | 4/2019 | Aoki et al. | |
| 10,743,375 | B2 | 8/2020 | Klein et al. | |
| 2010/0163404 | A1 * | 7/2010 | De ........................ | C23C 14/042 |
| | | | | 204/192.12 |
| 2015/0086301 | A1 * | 3/2015 | Rogers ................ | H01L 21/6838 |
| | | | | 414/217 |
| 2016/0005957 | A1 * | 1/2016 | Kodaira .............. | H01L 21/3065 |
| | | | | 438/3 |

(Continued)

FOREIGN PATENT DOCUMENTS

| | | |
|---|---|---|
| KR | 10-0720422 B1 | 5/2007 |
| KR | 10-0809541 B1 | 3/2008 |

(Continued)

OTHER PUBLICATIONS

Korean Notice of Allowance corresponding to KR Application No. 10-2022-0031483, dated Jul. 28, 2025 (7 pages).

*Primary Examiner* — Paul D Kim

(74) *Attorney, Agent, or Firm* — Womble Bond Dickinson (US) LLP

(57) ABSTRACT

A mapping device includes: a substrate engraved with an alignment pattern; an electrostatic chuck under the substrate and in contact with the substrate; and an anti-separation frame on the substrate and preventing the substrate from being separated.

10 Claims, 9 Drawing Sheets

(56)        References Cited

U.S. PATENT DOCUMENTS

2021/0231967 A1*  7/2021  Yanagisawa ......... G02B 27/646
2022/0197135 A1*  6/2022  Suzuki .................. G03F 7/0002

FOREIGN PATENT DOCUMENTS

KR      10-2013-0107919  A      10/2013
KR      10-2015-0070680  A       6/2015
KR      10-2016-0112434  A       9/2016
KR            10-1893180  B1      8/2018
KR      10-2019-0138192  A      12/2019
KR      10-2020-0121433  A      10/2020
KR            10-2179326  B1     11/2020

* cited by examiner

MAPPING DEVICE INCLUDING ELECTROSTATIC CHUCK AND ANTI-SEPARATION FRAME

CROSS-REFERENCE TO RELATED APPLICATION

The present application claims priority to and the benefit of Korean Patent Application No. 10-2022-0031483, filed on Mar. 14, 2022, the entire contents of which is incorporated herein by reference.

BACKGROUND

1. Field

Aspects of some embodiments of the present disclosure relate to a mapping device capable of being applied to a large-size apparatus and a mapping method using the mapping device.

2. Description of the Related Art

In general, a light emitting display device includes pixels and a light emitting element provided in each pixel. The light emitting element includes a light emitting layer located between two electrodes. A mask may be used to deposit the light emitting layer on a work substrate. In this case, it may be useful to secure absolute coordinates of a mask tension welding machine to minimize or reduce process dispersion of the mask.

The above information disclosed in this Background section is only for enhancement of understanding of the background and therefore the information discussed in this Background section does not necessarily constitute prior art.

SUMMARY

Aspects of some embodiments of the present disclosure include a mapping device capable of being applied to a large-size apparatus.

Aspects of some embodiments of the present disclosure include a mapping method using the mapping device, which is capable of being applied to the large-size apparatus.

Aspects of some embodiments of the inventive concept include a mapping device including a substrate engraved with an alignment pattern, an electrostatic chuck located under the substrate and being in contact with the substrate, and an anti-separation frame located on the substrate and preventing or reducing the substrate from being separated.

According to some embodiments, the anti-separation frame includes a first frame overlapping a center portion of the substrate and extending in a first direction and a second frame overlapping the center portion of the substrate and extending in a second direction crossing the first direction.

According to some embodiments, the anti-separation frame further includes a third frame overlapping a vertex of the substrate.

According to some embodiments, the mapping device further includes a main frame under the electrostatic chuck and supporting the substrate and the electrostatic chuck.

According to some embodiments, the main frame includes a bottom portion, sidewall portions protruding upward from the bottom portion of the main frame, a plurality of horizontal frames connected to two sidewall portions facing each other among the sidewall portions, extending in the first direction, and spaced apart from each other in the second direction crossing the first direction, and a plurality of vertical frames connected to the other two sidewall portions facing each other among the sidewall portions, extending in the second direction, and spaced apart from each other in the first direction.

According to some embodiments, the mapping device further includes a power supply unit under the electrostatic chuck and a high voltage power supply unit under the electrostatic chuck and converting a voltage provided from the power supply unit to a high voltage.

According to some embodiments, each of the power supply unit and the high voltage power supply unit does not overlap the horizontal frames and the vertical frames.

According to some embodiments, each of the first frame, the second frame, and the third frame is on the substrate and the sidewall portions of the main frame and covers a portion of an upper surface of the substrate, a portion of a side surface of the substrate, and a portion of a side surface of the electrostatic chuck.

According to some embodiments, the alignment pattern includes a horizontal grid line and a vertical grid line.

According to some embodiments, the alignment pattern is a grid pattern.

According to some embodiments, the substrate is a glass substrate.

Aspects of some embodiments of the inventive concept include a mapping method including placing a mapping device engraved with an alignment pattern on an equipment including a first axis extending in a first direction and an imaging unit, allowing the imaging unit to scan the mapping device on the equipment, and correcting coordinates on the equipment. The mapping device includes a substrate engraved with the alignment pattern, an electrostatic chuck under the substrate and being in contact with the substrate, and an anti-separation frame on the substrate and preventing the substrate from being separated.

According to some embodiments, the equipment further includes a second axis, and the second axis extends in a first direction and spaced apart from the first axis in a second direction crossing the first direction.

According to some embodiments, the imaging unit includes first imaging units on the first axis, and second imaging units on the second axis, and the first imaging units and the second imaging units are spaced apart from each other in the first direction.

According to some embodiments, the first axis and the second axis move in the second direction, and the first imaging units and the second imaging units move in the first direction.

According to some embodiments, the equipment has a horizontal length equal to or greater than 1850 mm (or about 1850 mm) and a vertical length equal to or greater than 1500 mm (or about 1500 mm).

According to some embodiments, the placing of the mapping device includes allowing an upper surface of the substrate engraved with the alignment pattern to be substantially parallel to a gravity direction.

According to some embodiments, the placing of the mapping device includes allowing an upper surface of the substrate engraved with the alignment pattern to cross a gravity direction.

According to some embodiments, the correcting of the coordinates on the equipment includes compensating for the coordinates by a distance between the alignment pattern and a center mark of the imaging unit.

According to some embodiments, the anti-separation frame includes a first frame overlapping a center portion of the substrate and extending in the first direction, a second frame overlapping the center portion of the substrate and extending in a second direction crossing the first direction, and a third frame overlapping a vertex of the substrate.

According to some embodiments of the present disclosure, the substrate included in the mapping device includes a single glass substrate that is capable of being manufactured in a relatively large size. According to some embodiments, the mapping process may be performed using the mapping device including the single substrate, and the mapping process is performed on the equipment with the large size.

According to some embodiments, when compared with the mapping operation performed using plural substrates, the precision of the equipment is improved, and the occurrence of process dispersion is reduced or eliminated. Thus, the production equipment efficiency may increase.

In addition, the mapping device according to some embodiments includes the electrostatic chuck and the substrate between the electrostatic chuck and the anti-separation frame. The anti-separation frame is on the substrate, the electrostatic chuck is under the substrate to fix the substrate using an electrostatic force, and thus, movement, falling, and/or separation of the substrate may be prevented or reduced. Accordingly, although the mapping device is used horizontally or vertically, movement, falling, or separation of the substrate may be prevented or reduced.

BRIEF DESCRIPTION OF THE DRAWINGS

The above and other aspects of some embodiments of the present disclosure will become more readily apparent by reference to the following detailed description when considered in conjunction with the accompanying drawings wherein.

DETAILED DESCRIPTION

Figure 1A:
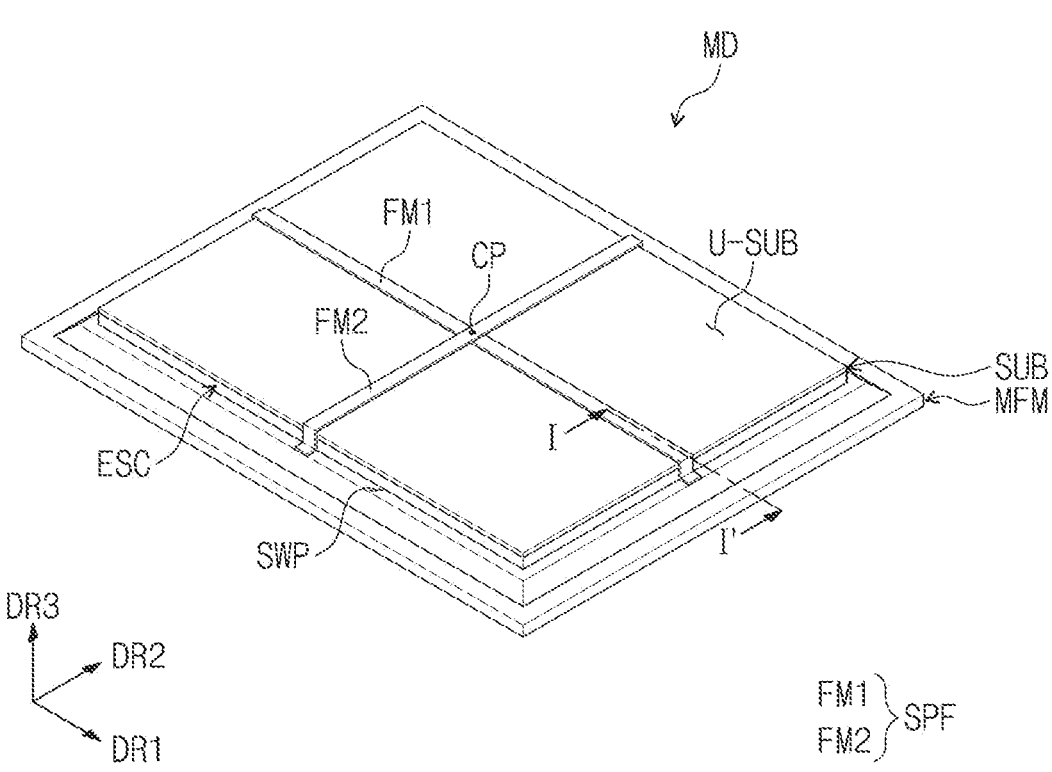
FIG. 1A is a perspective view of a mapping device according to some embodiments of the present disclosure.

In the present disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" may include any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another elements or features as shown in the figures.

It will be further understood that the terms "include" and/or "including", when used in this specification, specify the presence of stated features, integers, steps, operations, elements, and/or components, but do not preclude the presence or addition of one or more other features, integers, steps, operations, elements, components, and/or groups thereof.

The term "part" or "unit" as used herein is intended to mean a software component or a hardware component that performs a specific function. The hardware component may include, for example, a field-programmable gate array (FPGA) or an application-specific integrated circuit (ASIC). The software component may refer to an executable code and/or data used by the executable code in an addressable storage medium. Thus, the software components may be, for example, object-oriented software components, class components, and task components, and may include processes, functions, attributes, procedures, subroutines, segments of program code, drivers, firmware, micro codes, circuits, data, a database, data structures, tables, arrays, or variables.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, aspects of some embodiments of the present disclosure will be described in more detail with reference to accompanying drawings.

Figure 1B:
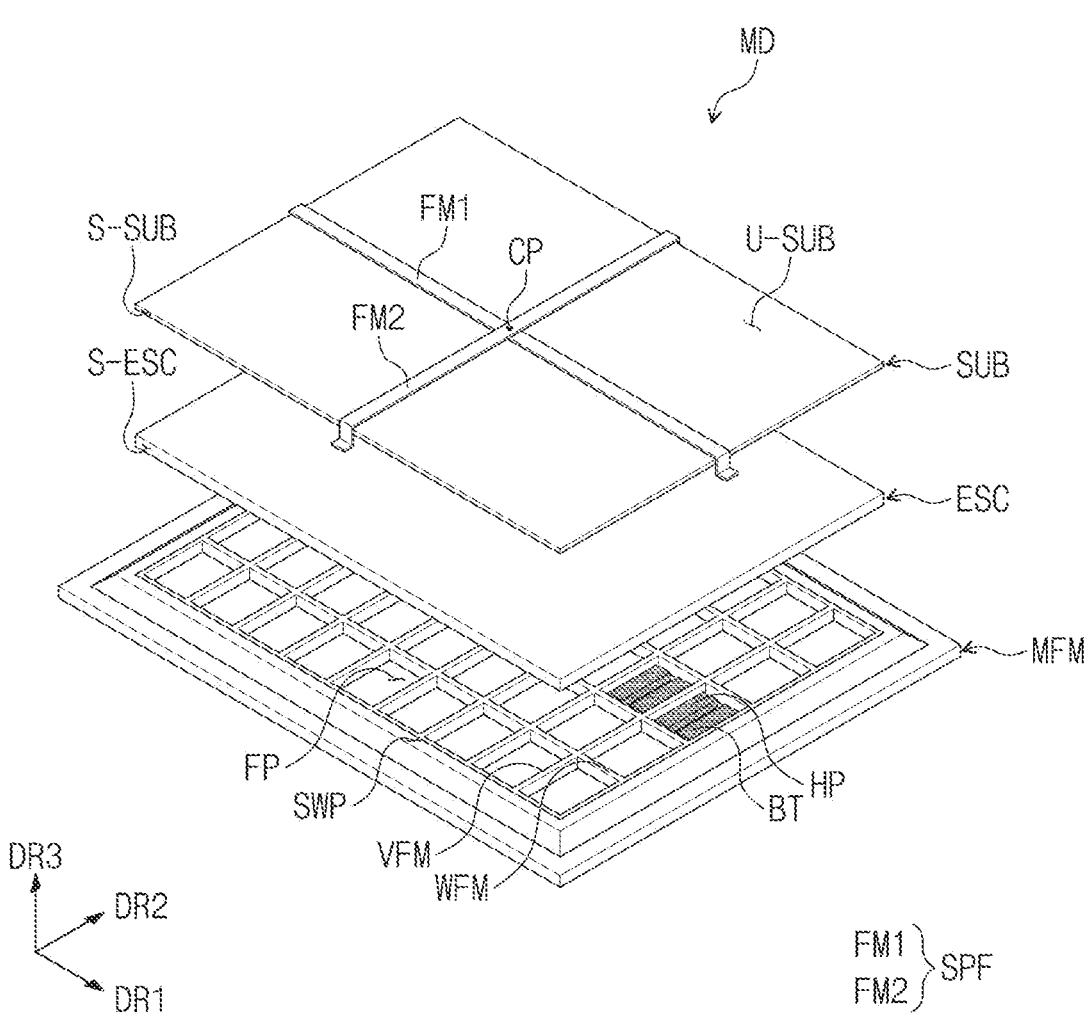
FIG. 1B is an exploded perspective view of a mapping device according to some embodiments of the present disclosure.
Figure 2:
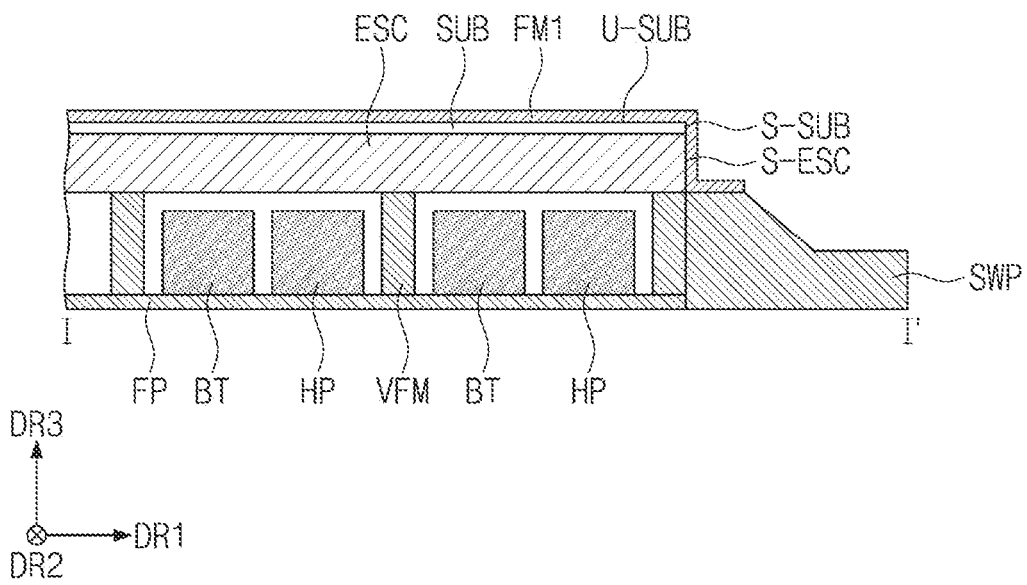
FIG. 2 is a cross-sectional view taken along a line I-I' of FIG. 1A.

FIG. 1A is a perspective view of a mapping device MD according to some embodiments of the present disclosure, and FIG. 1B is an exploded perspective view of the mapping device MD according to some embodiments of the present disclosure. FIG. 2 is a cross-sectional view taken along a line I-I' of FIG. 1A.

Referring to FIGS. 1A, 1B, and 2, the mapping device MD may include a main frame MFM, an electrostatic chuck ESC, a substrate SUB, an anti-separation frame SPF, a power supply unit BT, and a high voltage power supply unit HP. The mapping device MD may be placed on an equipment EQ (refer, for example, to FIG. 6A) and may perform a corrective work.

As an example, the equipment EQ may be a mask tension welding machine for a deposition process for manufacturing of a display panel. It may be desirable to minimize or reduce process dispersion of a mask to more precisely manufacture and correct the mask. In the manufacturing and correcting processes of the mask, absolute coordinate values of the mask tension welding machine may be desired, and the corrective work may be performed using the mapping device MD including a mask stage engraved with coordinates on an upper portion thereof to implement the absolute coordinate values.

The mapping device MD may have a rectangular shape with long sides extending in a first direction DR1 and short sides extending in a second direction DR2 crossing the first direction DR1 when viewed in a plane (or a plan view, e.g., a direction perpendicular or normal with respect to a plane defined by the first direction DR1 and the second direction DR2), however, the shape of the mapping device MD should not be limited to the rectangular shape. According to some embodiments, the mapping device MD may have a variety of shapes, e.g., a circular shape, a polygonal shape, or the like.

In the present disclosure, the expression "when viewed in a plane" may mean a state of being viewed in a third direction DR3 (e.g., a direction perpendicular to a plane defined by the first direction DR1 and the second direction DR2). In the present disclosure, the expression "when viewed in a cross-section" may mean a state of being viewed in the first direction DR1 or the second direction DR2. Meanwhile, directions indicated by the first, second, and third directions DR1, DR2, and DR3 may be relative to each other, and thus, the directions indicated by the first, second, and third directions DR1, DR2, and DR3 may be changed to other directions.

The main frame MFM may be located at a lowermost position of the mapping device MD. The main frame MFM may be located under the electrostatic chuck ESC and may support the substrate SUB and the electrostatic chuck ESC. The main frame MFM may include a bottom portion FP, sidewall portions SWP, a plurality of horizontal frames WFM, and a plurality of vertical frames VFM. The sidewall portions SWP may have a shape protruding from the bottom portion FP of the main frame MFM. As an example, the sidewall portions SWP may have a shape protruding from the bottom portion FP along four corners of the main frame MFM toward the third direction DR3.

The horizontal frames WFM may be connected to two sidewall portions SWP facing each other among the sidewall portions SWP. The horizontal frames WFM may extend in the first direction DR1 and may be arranged spaced apart from each other in the second direction DR2 crossing the first direction DR1. The vertical frames VFM may be connected to the other two sidewall portions SWP facing each other among the sidewall portions SWP. The vertical frames VFM may extend in the second direction DR2 and may be arranged to be spaced apart from each other in the first direction DR1.

The electrostatic chuck ESC may be located above the main frame MFM and may be located under the substrate SUB. The electrostatic chuck ESC may be in contact with a rear surface of the substrate SUB and may support the substrate SUB. The electrostatic chuck ESC may be completely attached to a front surface of the substrate SUB and may fix the substrate SUB using an electrostatic force. When the substrate SUB has a thin thickness and a large size, the substrate SUB may be sagged. The electrostatic chuck ESC may allow the substrate SUB to be fixed in a fully flat state, and thus, a flatness of the substrate SUB may be maintained.

The substrate SUB may be located on the electrostatic chuck ESC. An alignment pattern AP (refer to FIG. 4) may be engraved in the substrate SUB. The alignment pattern AP will be described in detail with reference to FIG. 4. The substrate SUB may be, but not limited to, a glass substrate.

The anti-separation frame SPF may be located on the substrate SUB and may prevent the substrate SUB from moving, falling, and being separated. Although the mapping device MD may be used horizontally or vertically, movement and separation of the substrate SUB may be prevented or reduced due to the anti-separation frame SPF.

The anti-separation frame SPF may include a first frame FM1 and a second frame FM2. The first frame FM1 may overlap a center portion CP of the substrate SUB and may extend in the first direction DR1. As an example, the first frame FM1 may be parallel (or substantially parallel) to the long sides of the substrate SUB. The second frame FM2 may overlap the center portion CP of the substrate SUB and may extend in the second direction DR2. As an example, the second frame FM2 may be substantially parallel to the short sides of the substrate SUB. The first frame FM1 and the second frame FM2 may cross each other at the center portion CP of the substrate SUB.

Referring to FIGS. 1A, 1B, and 2, each of the first frame FM1 and the second frame FM2 may be located on the substrate SUB and the sidewall portions SWP of the main frame MFM. Each of the first frame FM1 and the second frame FM2 may cover a portion of each of an upper surface U-SUB of the substrate SUB, a side surface S-SUB of the substrate SUB, and a side surface S-ESC of the electrostatic chuck ESC.

The power supply unit BT may be located under the electrostatic chuck ESC. The power supply unit BT may be electrically connected to the electrostatic chuck ESC and may provide a voltage to the electrostatic chuck ESC. The high voltage power supply unit HP may be located under the electrostatic chuck ESC. The high voltage power supply unit HP may be electrically connected to the electrostatic chuck ESC and the power supply unit BT, may change the voltage from the power supply unit BT to a high voltage, and may provide the changed high voltage to the electrostatic chuck ESC.

Each of the power supply unit BT and the high voltage power supply unit HP may not overlap the horizontal frames WFM and the vertical frames VFM of the main frame MFM. FIG. 1B shows two power supply units BT and two high voltage power supply units HP as a representative example. According to some embodiments, the number of the power supply units BT and the number of the high voltage power supply units HP may be three or more. In addition, FIG. 2 shows the structure in which two pairs of the power supply unit BT and the high voltage power supply unit HP are located between the vertical frames VFM, however, the arrangement of the power supply unit BT and the high voltage power supply unit HP should not be limited thereto or thereby. As an example, one power supply unit BT or one high voltage power supply unit HP may be located between the vertical frames VFM, and an area where the power supply unit BT or the high voltage power supply unit HP is not located may exist between the vertical frames VFM.

Figure 3A:
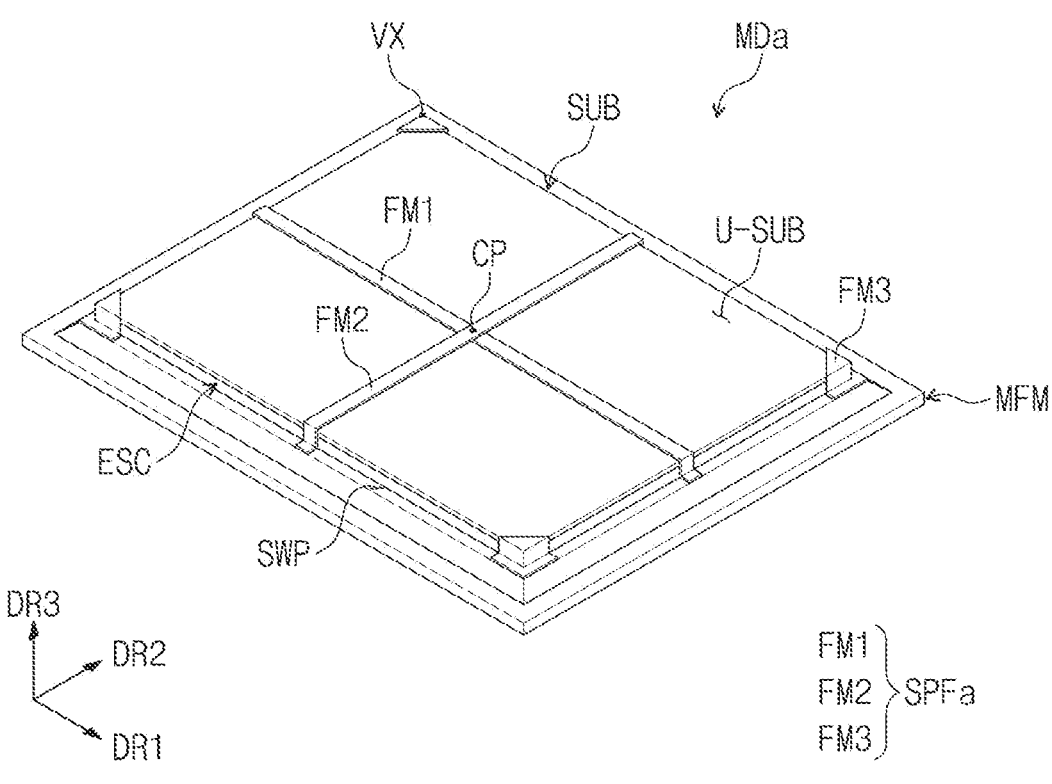
FIG. 3A is a perspective view of a mapping device according to some embodiments of the present disclosure.
Figure 3B:
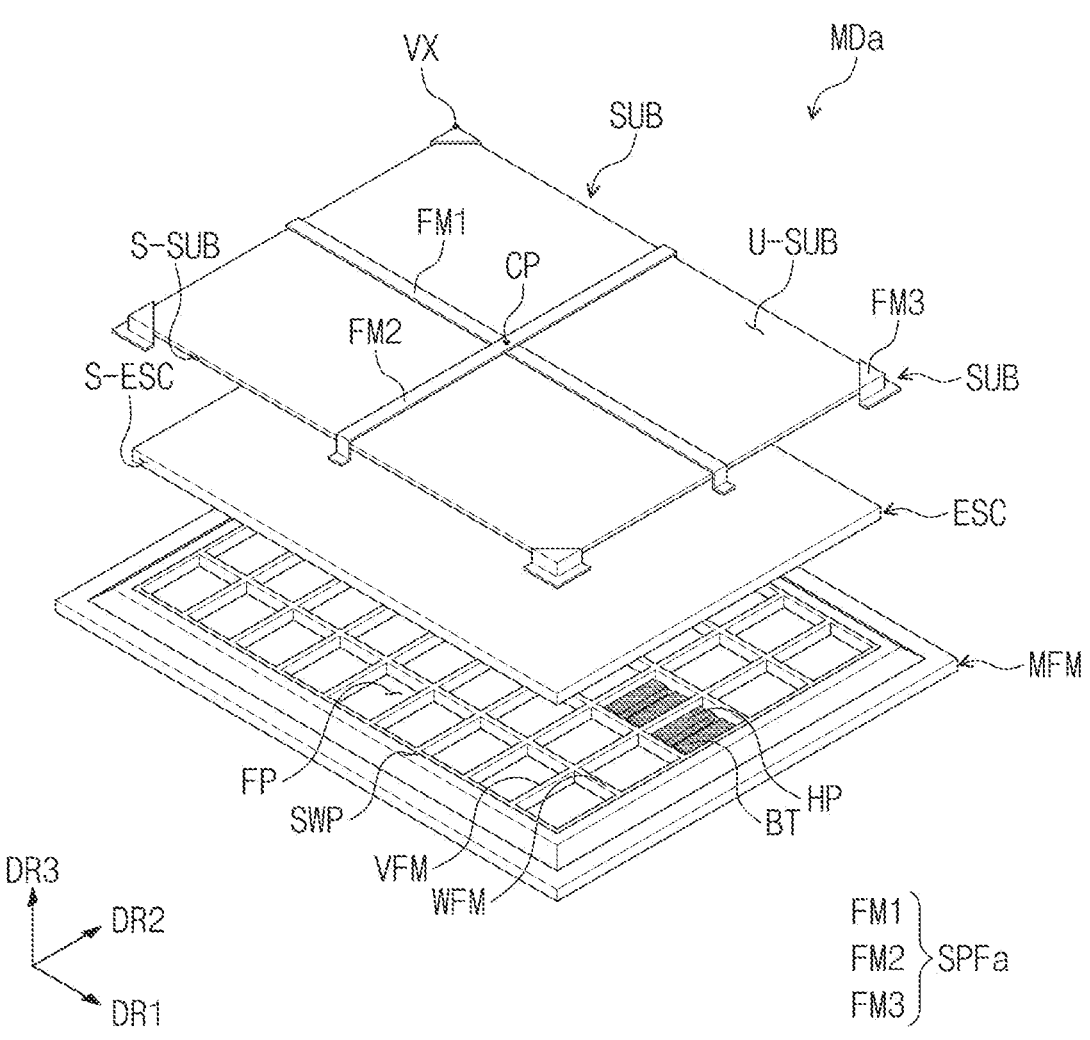
FIG. 3B is an exploded perspective view of a mapping device according to some embodiments of the present disclosure.

FIG. 3A is a perspective view of a mapping device MDa according to some embodiments of the present disclosure, and FIG. 3B is an exploded perspective view of the mapping device MDa according to some embodiments of the present disclosure. In FIGS. 3A and 3B, the same reference numerals denote the same elements in FIGS. 1A and 1B, and thus, some detailed descriptions of the same elements may be omitted.

Referring to FIGS. 2, 3A, and 3B, an anti-separation frame SPFa may include a first frame FM1, a second frame FM2, and a third frame FM3. That is, the anti-separation frame SPFa of FIG. 3A may further include the third frame FM3 when compared the anti-separation frame SPF of FIG. 1A.

The third frame FM3 may be arranged to overlap a vertex VX of a substrate SUB. The third frame FM3 may be located on the substrate SUB and sidewall portions SWP of a main frame MFM. The third frame FM3 may cover a portion of an upper surface U-SUB of the substrate SUB, a portion of a side surface S-SUB of the substrate SUB, and a portion of a side surface S-ESC of an electrostatic chuck ESC. The third frame FM3 may be located at the vertex VX of the substrate SUB and may prevent the substrate SUB from moving, falling, and being separated.

Figure 4:
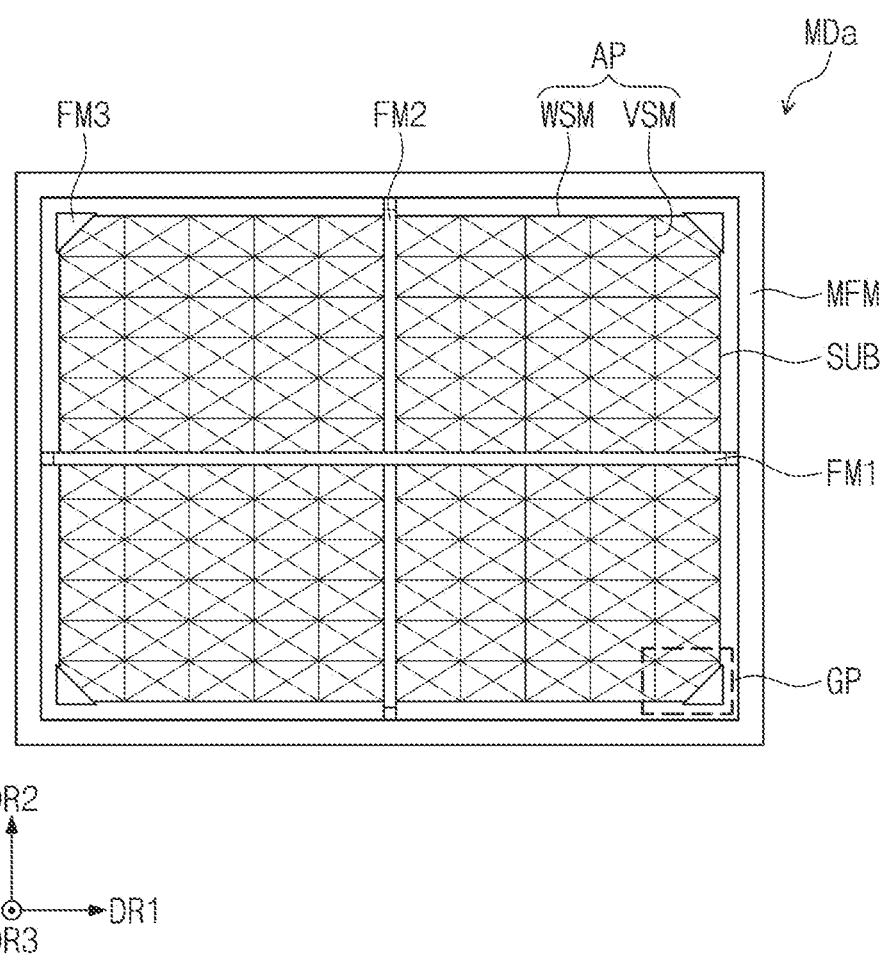
FIG. 4 is a plan view of a mapping device according to some embodiments of the present disclosure.

FIG. 4 is a plan view of the mapping device MDa according to some embodiments of the present disclosure.

Referring to FIG. 4, the alignment pattern AP may be engraved in the substrate SUB of the mapping device MDa. As an example, the alignment pattern AP may be engraved in the upper surface U-SUB of the substrate SUB. The substrate SUB may be located between the main frame MFM and the first, second, and third frames FM1, FM2, and FM3. The upper surface U-SUB of the substrate SUB may be exposed to the outside and may correspond to a surface of the substrate SUB, which faces the first, second, and third frames FM1, FM2, and FM3. The alignment pattern AP may include a horizontal grid line WSM and a vertical grid line VSM. The horizontal grid line WSM and the vertical grid line VSM may be a line marked at regular intervals and may be a measure of length. The alignment pattern AP may have diagonal lines of a quadrangular shape defined by the horizontal grid line WSM and the vertical grid line VSM in addition to the horizontal grid line WSM and the vertical grid line VSM.

According to some embodiments, the alignment pattern AP may be a grid pattern GP. The grid pattern GP may be a geometric figure with a lattice shape. The grid pattern GP may be a lattice shape used as a reference line in design.

Figure 5:
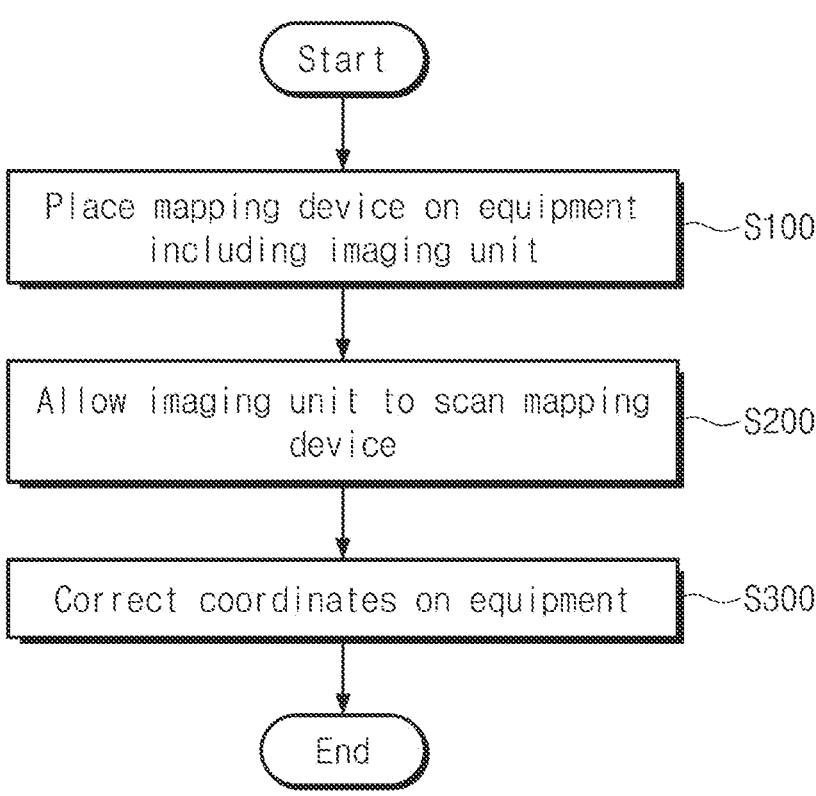
FIG. 5 is a flowchart of a mapping method according to some embodiments of the present disclosure.
Figure 6A:
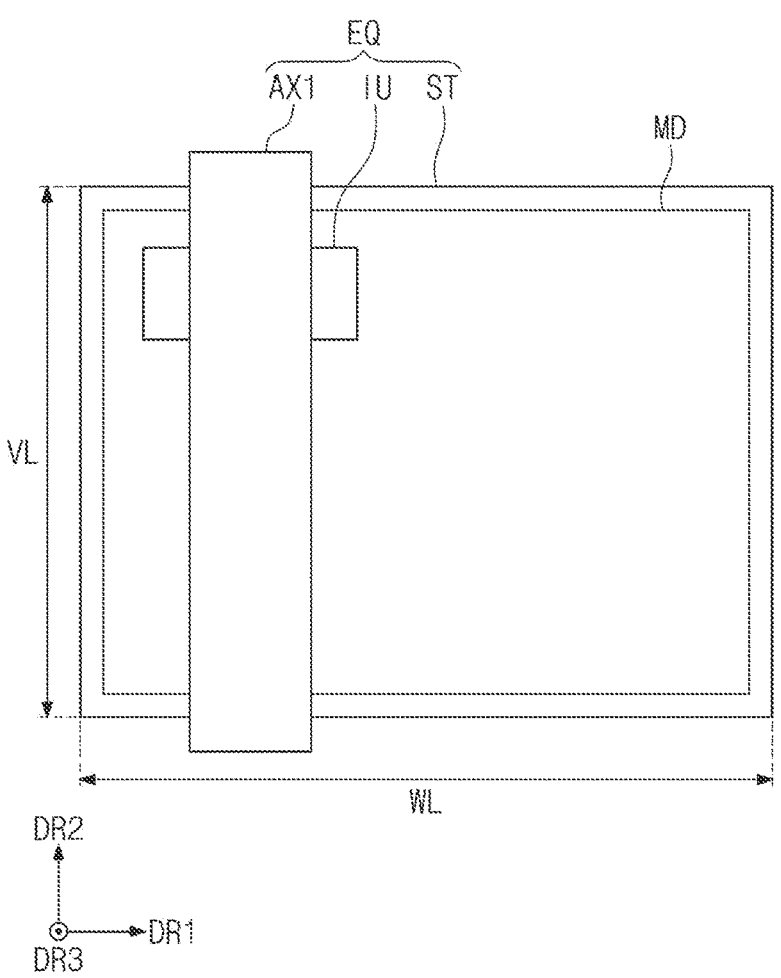
FIG. 6A is a plan view illustrating a mapping method according to some embodiments of the present disclosure.
Figure 6B:
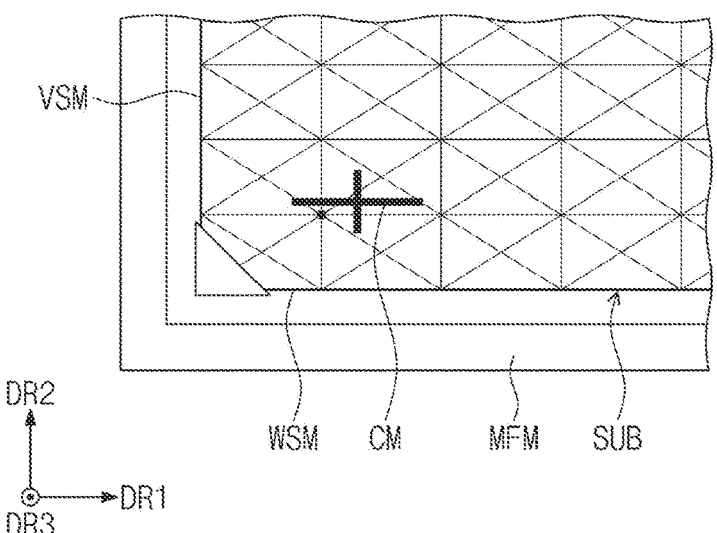
FIG. 6B is a plan view of a portion of a mapping device and a center mark according to some embodiments of the present disclosure.

FIG. 5 is a flowchart of a mapping method according to some embodiments of the present disclosure. FIG. 6A is a plan view illustrating a mapping method according to some embodiments of the present disclosure. FIG. 6B is a plan view of a portion of a mapping device and a center mark according to some embodiments of the present disclosure.

Referring to FIGS. 5 and 6A, the mapping device MD may be located on an equipment EQ (S100). In FIGS. 5 and 6A, the mapping device MD (refer to FIG. 1A) will be described as a representative example, however, the mapping device may be the mapping device MDa shown in FIG. 3A.

The equipment EQ may be the mask tension welding machine for a deposition of a display panel. It may be desirable to minimize or reduce the process dispersion of the mask to precisely manufacture and correct the mask. In the manufacturing and correcting processes of the mask, the absolute coordinate values of the mask tension welding machine may be required, and the corrective work may be performed using the mapping device MD including the mask stage engraved with coordinates on the upper portion thereof to implement the absolute coordinate values.

The equipment EQ may include a stage ST, a first axis AX1, and an imaging unit IU. The mapping device MD may be located on the stage ST of the equipment EQ. The first axis AX1 may extend in the second direction DR2 and may move in the first direction DR1. The imaging unit IU may be located on the first axis AX1 and may move in the second direction DR2. As an example, the imaging unit IU may be located on a rear surface of the first axis AX1 to scan the mapping device MD. The imaging unit IU may be located between the first axis AX1 and the mapping device MD.

The equipment EQ may have a horizontal length WL equal to or greater than about 1850 mm and a vertical length VL equal to or greater than about 1500 mm. The substrate SUB included in the mapping device MD may include a single glass substrate that may be manufactured in a large-size. Accordingly, the mapping may be performed using the mapping device MD including the single substrate SUB to perform the mapping on the large-size equipment EQ. As a result, when compared with the mapping operation performed using a mapping device including multiple substrates, the precision of the equipment EQ may be improved, and the occurrence of process dispersion may be reduced or eliminated. In addition, investment costs may decrease, and thus, a production equipment efficiency may increase.

According to some embodiments, the mapping device MD may include the electrostatic chuck ESC and the substrate SUB located between the electrostatic chuck ESC and the anti-separation frame SPF. Accordingly, movement, falling, sagging, or separation of the substrate SUB may be prevented or reduced by the electrostatic chuck ESC and the anti-separation frame SPF.

The mapping device MD or MDa may be arranged to allow the upper surface U-SUB (refer to FIG. 1A) of the substrate SUB (refer to FIG. 1A) of the mapping device MD or MDa to be substantially parallel to a gravity direction. As an example, the gravity direction and a normal line direction of the upper surface of the mapping device MD or MDa may cross each other. In this case, a normal line direction of the equipment EQ may be substantially parallel to the normal line direction of the upper surface of the mapping device MD or MDa. The mapping device MD or MDa may be located on the upper surface of the equipment EQ arranged in a vertical direction. That is, the mapping device MD or MDa may be arranged in the vertical direction (or a direction perpendicular to a ground). According to some embodiments of the present disclosure, since the mapping device MD or MDa includes the electrostatic chuck ESC and the anti-separation frame SPF or SPFa, the substrate may be prevented from moving, falling, and being separated even though the mapping device MD or MDa is arranged in the vertical direction.

According to some embodiments, the mapping device MD or MDa may be arranged in a horizontal direction with respect to the ground. As an example, the mapping device MD or MDa may be located on the equipment EQ arranged in the horizontal direction. In this case, the upper surface U-SUB of the substrate SUB of the mapping device MD or MDa may cross the gravity direction. As an example, the normal line direction of the equipment EQ, the normal line direction of the upper surface of the mapping device MD or MDa, and the gravity direction may be substantially parallel to each other.

Referring to FIGS. 1A, 4, 5, and 6A, the imaging unit IU may scan the mapping device MD (S200). The imaging unit IU may scan the alignment pattern AP of the substrate SUB. The imaging unit IU may scan a point at which the horizontal grid line WSM crosses the vertical grid line VSM of the alignment pattern AP of the substrate SUB. The imaging unit IU may scan a distance between the center mark of the imaging unit IU and the point at which the horizontal grid line WSM crosses the vertical grid line VSM. The imaging process may be performed on all points each at which the horizontal grid line WSM crosses the vertical grid line VSM.

Referring to FIGS. 1A, 4, 5, 6A, and 6B, the coordinates on the equipment EQ may be corrected based on the scanned image (S300). The coordinates may be compensated by the distance between the alignment pattern AP and the center mark CM of the imaging unit IU. As an example, when the alignment pattern AP is spaced apart from the center mark CM of the imaging unit IU in the first direction DR1 by about 0.2 micrometers and spaced apart from the center mark CM of the imaging unit IU in the second direction DR2 by about-0.3 micrometers, the position of the imaging unit IU may be compensated by about 0.2 micrometers in a direction opposite to the first direction DR1 and by about 0.3 micrometers in the second direction DR2, and thus, the alignment pattern AP may coincide with the center mark CM of the imaging unit IU. The correcting process may be performed using the compensated coordinates.

FIG. 6A shows one imaging unit as a representative example, however, the number of the imaging units IU should not be limited thereto or thereby. As an example, two or more imaging units IU may be located on the first axis AX1 to scan the mapping device MD.

Figure 7:
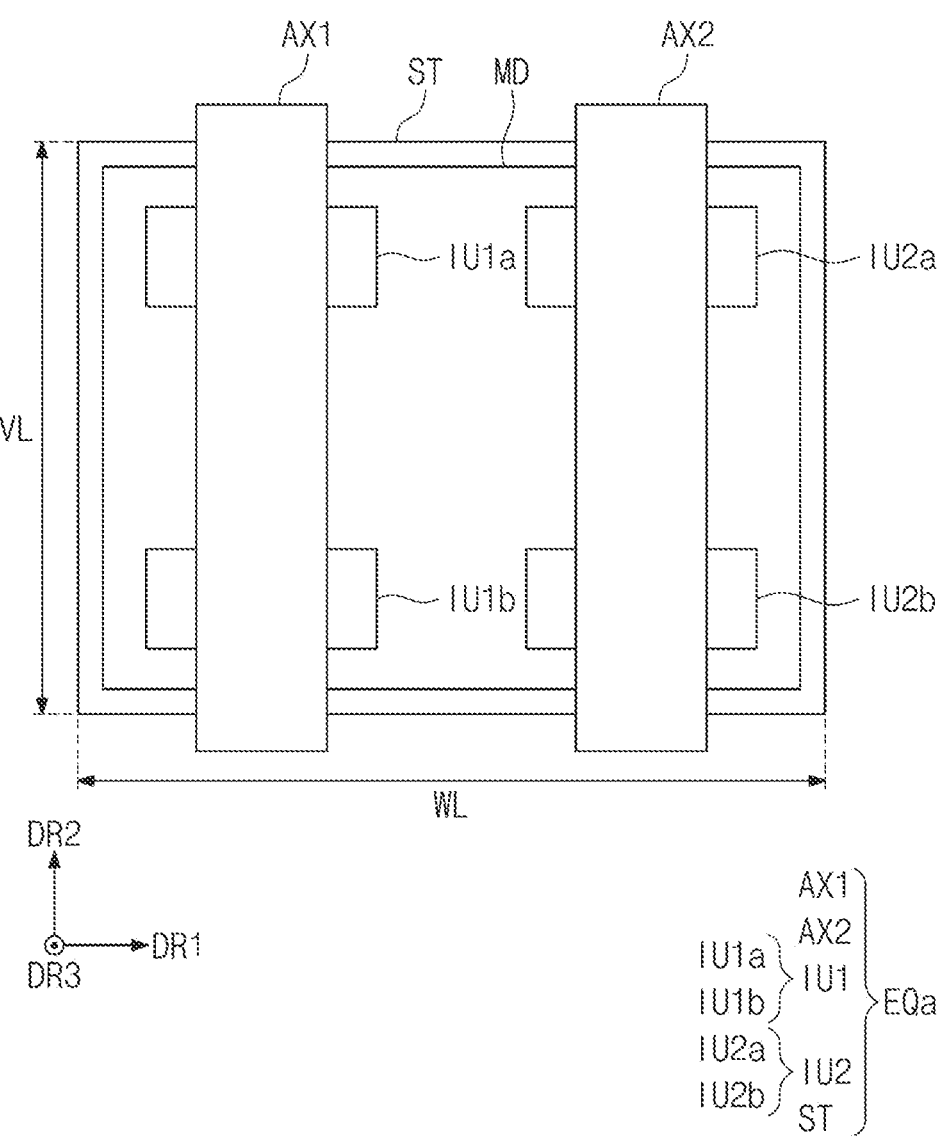
FIG. 7 is a plan view illustrating a mapping method according to some embodiments of the present disclosure.

FIG. 7 is a plan view illustrating a mapping method according to some embodiments of the present disclosure. In FIG. 7, the same reference numerals denote the same elements in FIG. 6A, and thus, some detailed descriptions of the same elements may be omitted.

Referring to FIG. 7, an equipment EQa may include a stage ST, a first axis AX1, a second axis AX2, and a plurality of imaging units IU1 and IU2. That is, the equipment EQa of FIG. 7 may further include the second axis AX2 and a plurality of imaging units IU1b, IU2a, and IU2b when compared with the equipment EQ of FIG. 6A.

The second axis AX2 may extend in the second direction DR2 and may move in the first direction DR1. The second axis AX2 may be arranged to be spaced apart from the first axis AX1 in the first direction DR1.

The imaging units IU1 and IU2 may include a plurality of first imaging units IU1 and a plurality of second imaging units IU2. The first imaging units IU1 may include two first imaging units IU1a and IU1b. The first imaging units IU1a and IU1b may be located on the first axis AX1 and may move in the second direction DR2. The first imaging units IU1a and IU1b may be arranged to be spaced apart from each other in the second direction DR2. As an example, the first imaging units IU1a and IU1b may be located on a rear surface of the first axis AX1 to scan the mapping device MD.

The second imaging units IU2 may be located on the second axis AX2 and may move in the second direction DR2. The second imaging units IU2 may include two second imaging units IU2a and IU2b. The second imaging units IU2a and IU2b may be arranged to be spaced apart from each other in the second direction DR2. As an example, the second imaging units IU2a and IU2b may be located on a rear surface of the second axis AX2 to scan the mapping device MD.

FIG. 7 shows two first imaging units IU1 and two second imaging units IU2 as a representative example, however, the number of each of the imaging units IU1 and IU2 should not be limited thereto or thereby. As an example, the equipment EQa may include one first imaging unit IU1 and three second imaging units IU2. In addition, FIG. 7 shows two axes AX1 and AX2 as a representative example, however, the number of axes AX1 and AX2 should not be limited thereto or thereby. The number of axes may increase depending on a size of the equipment EQa. As an example, three or more axes may be used.

Although aspects of some embodiments of the present disclosure have been described, it is understood that the present disclosure should not be limited to these embodiments but various changes and modifications can be made by one ordinary skilled in the art within the spirit and scope of the present disclosure as hereinafter claimed. Therefore, the disclosed subject matter should not be limited to any single embodiment described herein, and the scope of embodiments according to the present inventive concept shall be determined according to the attached claims, and their equivalents.

What is claimed is:

1. A mapping device comprising:
a substrate engraved with an alignment pattern;
an electrostatic chuck under the substrate and in contact with the substrate; and
an anti-separation frame on the substrate for preventing movement of the substrate,
wherein the anti-separation frame comprises:
a first frame overlapping a center portion of the substrate and extending in a first direction; and
a second frame overlapping the center portion of the substrate and extending in a second direction crossing the first direction such that the first frame and the second frame cross each other.

2. The mapping device of claim 1, wherein the anti-separation frame further comprises a third frame overlapping a vertex of the substrate.

3. The mapping device of claim 2, further comprising a main frame under the electrostatic chuck and supporting the substrate and the electrostatic chuck.

4. The mapping device of claim 3, wherein the main frame comprises:
a bottom portion;
sidewall portions protruding upward from the bottom portion of the main frame;
a plurality of horizontal frames connected to two sidewall portions facing each other among the sidewall portions, extending in the first direction, and spaced apart from each other in the second direction crossing the first direction; and
a plurality of vertical frames connected to the other two sidewall portions facing each other among the sidewall portions, extending in the second direction, and spaced apart from each other in the first direction.

5. The mapping device of claim 4, further comprising:
a power supply unit under the electrostatic chuck; and
a high voltage power supply unit under the electrostatic chuck and converting a voltage provided from the power supply unit to a high voltage.

6. The mapping device of claim 5, wherein each of the power supply unit and the high voltage power supply unit does not overlap the horizontal frames and the vertical frames.

7. The mapping device of claim 4, wherein each of the first frame, the second frame, and the third frame is on the substrate and the sidewall portions of the main frame and covers a portion of an upper surface of the substrate, a portion of a side surface of the substrate, and a portion of a side surface of the electrostatic chuck.

8. The mapping device of claim 1, wherein the alignment pattern comprises a horizontal grid line and a vertical grid line.

9. The mapping device of claim 1, wherein the alignment pattern has a grid pattern.

10. The mapping device of claim 1, wherein the substrate is a glass substrate.

\* \* \* \* \*